United States Patent [19]

Egawa et al.

[11] Patent Number: 5,068,709

[45] Date of Patent: Nov. 26, 1991

[54] SEMICONDUCTOR DEVICE HAVING A BACKPLATE ELECTRODE

[75] Inventors: Hidemitsu Egawa, Tokyo; Riichirou Aoki, Ichikawa; Katsuya Okumura, Yokohama, all of Japan

[73] Assignee: Kabushiki Kaisha Toshiba, Kawasaki, Japan

[21] Appl. No.: 380,024

[22] Filed: Jul. 14, 1989

Related U.S. Application Data

[62] Division of Ser. No. 028,386, Mar. 20, 1987, Pat. No. 4,875,088.

[30] Foreign Application Priority Data

Mar. 29, 1986 [JP] Japan .................................. 61-72116

[51] Int. Cl.$^5$ ...................... H01L 23/48; H01L 29/46
[52] U.S. Cl. ....................................... 357/71; 437/192
[58] Field of Search .................. 437/192, 190; 357/67, 357/71, 65

[56] References Cited

U.S. PATENT DOCUMENTS

| | | | |
|---|---|---|---|
| 4,478,881 | 10/1984 | Bartur et al | 427/90 |
| 4,574,470 | 3/1986 | Burt | 29/590 |
| 4,631,805 | 12/1986 | Olsen et al. | 29/588 |
| 4,765,845 | 8/1988 | Takada et al. | 136/258 |

FOREIGN PATENT DOCUMENTS

| | | | |
|---|---|---|---|
| 011660 | 10/1981 | Fed. Rep. of Germany | 437/192 |
| 57-68040 | 4/1982 | Japan | 437/192 |

Primary Examiner—Jerome Jackson, Jr.
Assistant Examiner—D. Monin
Attorney, Agent, or Firm—Finnegan, Henderson, Farabow, Garrett, and Dunner

[57] ABSTRACT

A semiconductor device includes a semiconductor pellet, and a metal nitride film or a metal silicide film, each having conductivity and an anti-oxidation property, and being formed on one surface of the pellet to cause the surface to have a substantially uniform potential.

10 Claims, 3 Drawing Sheets

F I G. 5
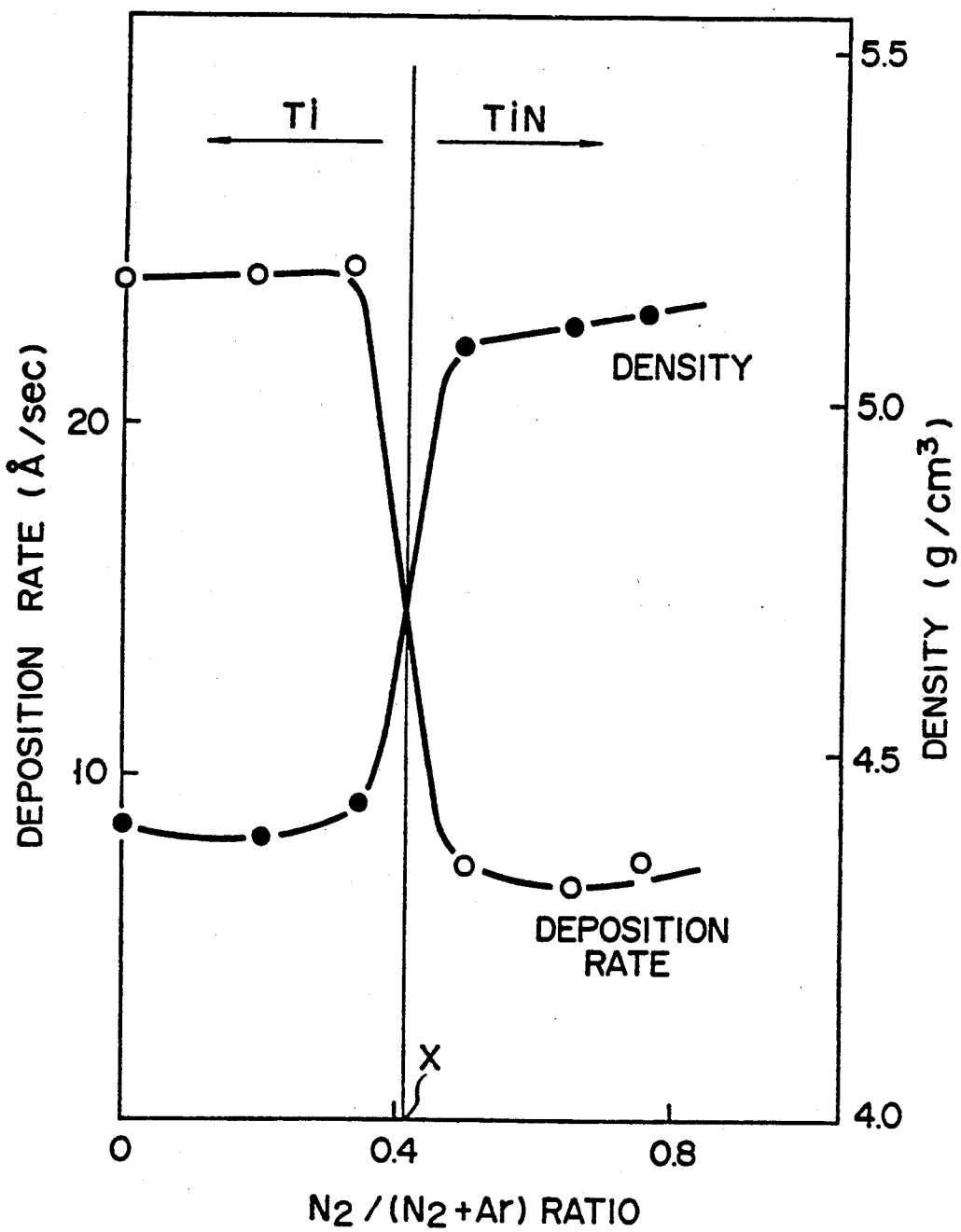

F I G. 6
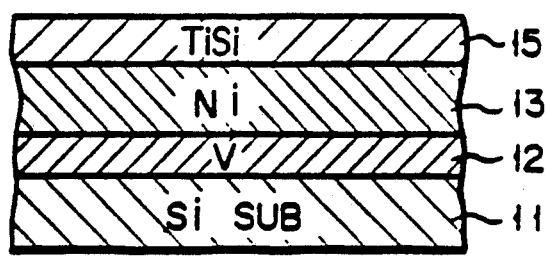
F I G. 7

SEMICONDUCTOR DEVICE HAVING A BACKPLATE ELECTRODE

This is a division of application Ser. No. 07/028,386, filed Mar. 20, 1987 now U.S. Pat. No. 4,875,088.

BACKGROUND OF THE INVENTION

The present invention relates to a semiconductor device having a backplate electrode for obtaining a uniform backplate potential of a semiconductor pellet.

Generally, when a semiconductor pellet integrating a number of circuit elements therein is mounted or attached to its frame, the electrical connections between circuit elements and input/output terminals or between the circuit elements and the circuit ground, a heat dissipating property from the pellet to the frame, and the mount strength between the pellet and the frame must be taken into consideration. The mount strength must be highly reliable for a long period of time.

In order to stabilize operations of circuits integrated in the pellet, a metal film is normally applied on a backplate of the semiconductor pellet to cause a substrate of the pellet to have the same potential as a whole. The metal film has, e.g., a three-layer structure, as shown in FIG. 1. That is, vanadium (V) substrate contacting layer 12 is formed on silicon (Si) substrate 11, nickel (Ni) interlayer 13 is formed on V layer 12, and gold (Au) surface layer 14 is formed on Ni interlayer 13. Ni interlayer 13, i.e., a second layer of the above structure, is used as a backplate-electrode main body for obtaining a uniform backplate potential of the semiconductor pellet. V layer 12, i.e., a first layer of the structure, serves to improve an electrical characteristic of the pellet, particularly to reduce the contact resistance between Ni interlayer 13 and Si substrate 11 and to increase a physical adhesive strength between interlayer 13 and substrate 11. Third layer 14 is provided to prevent oxidation of Ni interlayer 13 and is often made of an Au film (or an Au alloy film) having an excellent moisture-proof property.

In order to mount the semiconductor pellet having the above structure to a frame, when a main circuit element in the pellet is a power element which generates a large amount of heat, a solder-mount method or a eutectic-mount method is used. On the other hand, when a circuit in the pellet is constituted by elements which generate less heat, a simple mount method using a conductive resin can be utilized.

In FIG. 1, if solder mounting is performed, using Ni interlayer 13 as a backplate surface layer of the semiconductor pellet, without coating Ni interlayer 13 with Au layer 14, an oxide film is formed on the surface of Ni interlayer 13, causing poor conductivity. On the other hand, even when the structure of FIG. 1, whose backplate surface layer is coated with Au layer 14, is used, Au layer 14 having a film thickness of 2,000 Å or more is needed to obtain a perfect oxidation-preventing effect, because a thin Au film is porous. In addition, although Au is superior in moisture resistance, it tends to react with other materials to pose problems. For example, Au reacts with Sn in solder to form an Au-Sn alloy. However, because of its high eutectic reaction speed, the Au-Sn alloy tends to be a dispersion-type alloy of a brittle $\beta$ phase instead of one having a uniform $(\alpha+\beta)$ eutectic texture For this reason, the Au film used during solder mounting lacks reliability in terms of physical strength. In addition, when the Au film reacts with the Si substrate, electrical resistance of the Au film is increased. Furthermore, when a semiconductor pellet having no Au film at its backplate surface is mounted on the frame by a conductive resin, defects tend to occur due to oxidation of the Ni film. Even when the backplate surface of the pellet is coated by an Au film, if its thickness is less than 2000 Å, since such a thin Au film often involves pinholes and is porous as has been mentioned, the resultant goods are liable to be defective. This is because an acid or alkaline solvent decomposed from the resin accelerates oxidation of the Ni film at a higher temperature and higher humidity.

As described above, the backplate electrode surface layer (a) must not be easily oxidized, (b) must not easily react with other materials (elements), and (c) must have a good conductivity. In addition, in terms of device cost, it is desired that the backplate electrode surface layer (d) can be manufactured using an inexpensive material, rather than an expensive noble metal such as Au.

SUMMARY OF THE INVENTION

It is an object of the present invention to provide a semiconductor device having a backplate electrode which is highly reliable without using a noble metal such as Au.

In order to achieve the above object, according to the present invention, a backplate electrode surface layer of a semiconductor pellet is made of a metal nitride film or a metal silicide film. A relatively inexpensive metal element such as Ti, W, Mo, Mn, C, or Ni is used for the metal nitride film, and a relatively inexpensive material such as Cu, Cr, Ni, Fe, Co, W, Mn, or Pd is sued for the metal silicide film. By using the metal nitride or metal silicide film as described above, a relatively inexpensive backplate electrode surface layer, which is not easily oxidized nor reacts with other materials (elements), and which has a good conductivity, can be obtained.

BRIEF DESCRIPTION OF THE DRAWINGS

FIGS. 2 and 6 are sectional views of a part of a semiconductor pellet having a backplate electrode according to an embodiment of the present invention, in which an Au layer (14) of FIG. 1 is replaced either with a TiN or TiSi layer (15);

FIGS. 4 and 7 are sectional views of a part of a semiconductor pellet having a backplate electrode according to still another embodiment of the present invention, in which 3 layers (12 to 14) of FIG. 1 are replaced with a single layer, i.e., either a TiN or TiSi layer (15); and FIG. 5 is a graph showing how a deposition rate and density of TiN formed by reactive sputtering are changed in accordance with a mixing ratio (partial pressure) of N2 gas contained in an Ar/N2 gas mixture.

DETAILED DESCRIPTION OF THE PREFERRED EMBODIMENTS

Figure 1:
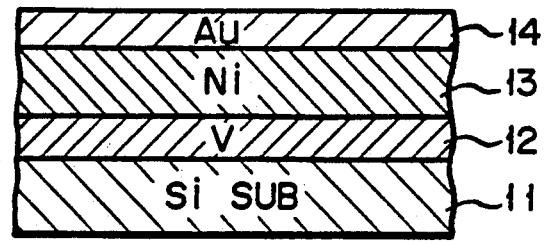
FIG. 1 is a sectional view of a part of a conventional semiconductor pellet having a backplate electrode.

An embodiment of the present invention will now be described in detail with reference to the accompanying drawings. Note that throughout the drawings, the same parts are denoted by the same reference numerals and a repetitive description thereof will be omitted.

Figure 2:
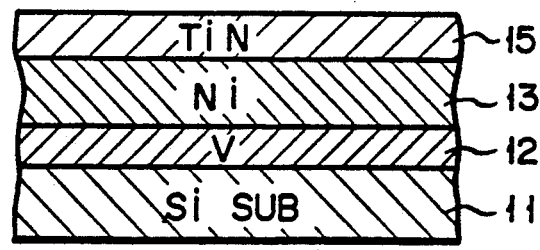

FIG. 2 shows a sectional structure of this embodiment. This embodiment is characterized by using titanium nitride (TiN) film 15 as a backplate electrode surface layer. Film 15 is deposited to have a film thickness of 1,000 Å by a reactive sputtering method, using a Ti target in an atmosphere of an Ar/N$_2$ gas mixture (a mixing ratio of which is Ar:N$_2$=1:1) of, e.g., 0.3 Pa as a sputtering gas. Note that the above titanium nitride film may be replaced with any nitrides of the following metals which form an interstitial nitride having conductivity and chemical stability:

W, Zr, Hf, Mo, Mn, Co, and Ni

Methods of forming these metal nitride films are as follows:

(1) Metal nitride film 15 is formed by a reactive sputtering method performed in an atmosphere of a gas mixture of an inert gas and nitrogen gas, using any of the above metals as a target;

(2) Film 15 is formed by a reactive vapor deposition method performed in an atmosphere of a gas mixture of an inert gas and nitrogen gas, using any of the above metals as a deposition source;

(3) Film 15 is formed by a sputtering method in an atmosphere of an inert gas, using a nitride of any of the above metals as a target.

Note that in order to obtain a practical titanium nitride TiN, a mixing ratio (a partial pressure ratio) of N$_2$ gas contained in an Ar/N$_2$ gas mixture used in a reactive sputtering method, using Ti as a target, must be larger than point X in the graph of FIG. 5. (If the partial pressure ratio of N$_2$ gas is smaller than X, substantially no TiN is produced.) The specific point, as indicated by X for Ti in FIG. 5, is present for each of the nitrides other than titanium. However, each specific point X of nitrides other than titanium can be obtained for each nitride by experiments when the present invention is practiced. In addition, when an inert gas other than Ar is used as sputtering gas, a location of specific point X is preferably confirmed for each nitride by an experiment.

Results of a reliability test, i.e., a moisture resistant test, a bias-temperature test, and a heat cycle test, performed for a structure of the present embodiment in FIG. 2, a structure of the conventional example in FIG. 1, and a structure obtained by removing layer 14 for preventing oxidation from the conventional example (a two-layer structure of layer 13/layer 12), will be shown below. The reliability test was performed for 100 samples of each of the above 3 structures. Layer 12, interlayer 13, and layer 14 of the sample were formed by a deposition method. An Sn/Pb alloy containing 5% of Pb was used for solder mounting, and a polyimide resin was used for resin mounting. The moisture resistant test was performed under the conditions of a pressure of 2.5 atm and a humidity of 100% for 1,000 hours. The bias-temperature test was performed at an atmospheric temperature of 125° C. and applied bias 5 volts to a substrate for 1,000 hours. The heat cycle test was performed for 200 cycles in which 1 cycle was −65° C. (30 min)→200° C. (30 min). The results of experiments thus performed will be shown in Table 1. Table 1 shows a defect generation rate in the above reliability test.

TABLE 1

| Backplate Electrode Film Structure | Moisture Resistance Test | Bias-temperature Test | | Heat Cycle Test | |
| --- | --- | --- | --- | --- | --- |
| | | Resin Mounting | Solder Mounting | Resin Mounting | Solder Mounting |
| Si-sub/ V (300 Å)/ Ni (4000 Å) | 100/100 | 19/100 | 100/100 | 25/100 | 100/100 |
| Si-sub V (300 Å)/ Ni (4000 Å)/ Au (1000 Å) | 17/100 | 2/100 | 8/100 | 4/100 | 12/100 |
| Si-sub/ V (300 Å)/ Ni (4000 Å)/ Au (2000 Å) | 0/100 | 0/100 | 0/100 | 0/100 | 0/100 |
| Si-sub/ V (300 Å)/ Ni (4000 Å)/ TiN (1000 Å) | 0/100 | 0/100 | 0/100 | 0/100 | 0/100 |

As shown in Table 1, when 1,000-Å thick TiN film 15 was used as a backplate electrode surface layer, no defect was found as in the case wherein expensive Au film 14 having a film thickness of 2,000 Å was used as a backplate electrode surface layer. That is, high reliability can be obtained by adopting a relatively inexpensive TiN film.

In addition, when the above reliability test was performed using a tungsten nitride film as layer 15, no defect was found, either.

Figure 3:
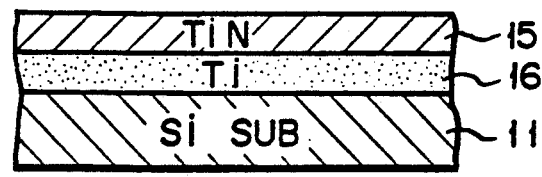
FIG. 3 is a sectional view of a part of a semiconductor pellet having a backplate electrode according to another embodiment of the present invention, in which 3 layers (12 to 14) of FIG. 1 are replaced with 2 layers, i.e., a Ti layer (16) and a TiN layer (15)

Note that the underlayer electrode film of film 15 is not limited to Ni. For example, a two-layer structure of Ti layer 16/TiN layer 15 may be adopted as a backplate electrode film, as shown in FIG. 3. In this case, a process of manufacturing a semiconductor device can be simplified.

Figure 4:
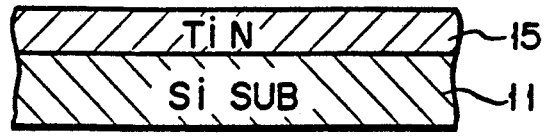

In addition, when mount strength between an Si substrate and a TiN film is sufficiently obtained by annealing the semiconductor pellet after the backplate electrode surface layer is formed, layer 15 of a TiN single layer, as shown in FIG. 4, may be adopted. In this case, the process of manufacturing the semiconductor device can be further simplified.

Although the metal nitride film is used as a backplate electrode surface layer in the above embodiments, a silicified metal film can also be used as the backplate electrode surface layer. Examples of metal elements which can be used for silicides are:

Ti, Mo, Cu, Cr, Ni, Fe, Co, W, Mn, and Pd

Methods of forming these metal silicide films are as follows:

(1) Metal silicide film 15 is formed by a sputtering method performed in an atmosphere of an inert gas, using any of the above metals and silicon as targets;

(2) Film 15 is formed by a sputtering method performed in an atmosphere of an inert gas, using a silicide of any of the above metals as a target.

The said reliability test was performed both for backplate electrode surface layer 15 comprising a titanium silicide (TiSi) film (see FIG. 6) and that comprising a molybdenum silicide (MoSi) film, and no defect was found as in the case wherein the titanium nitride (TiN) film was used.

Note that when the semiconductor pellet is annealed after formation of the backplate electrode surface so that the silicon substrate reacts with the titanium silicide or the titanium film to reinforce the adhesive therebetween, layer 15 of a single layer, as shown in FIG. 7, can be adopted.

As has been described above, according to the present invention, a semiconductor device, which is superior in moisture resistance and the like, and has a high reliability, can be manufactured at low cost.

What is claimed is:

1. A semiconductor device comprising:
   a semiconductor pellet having a top surface on which an integrated circuit is formed an a back surface formed by a semiconductor material, wherein said semiconductor pellet is formed of silicon; and
   backplate electrode means, including a metal silicide film having conductivity and an anti-oxidation property and wherein the metal silicide film forms the outermost surface of the backplate electrode means, said backplate electrode means being formed on the entire back surface of said pellet, for obtaining at said back surface of said pellet a substantially uniform backplate potential;
   wherein said metal silicide film essentially consists of a silicide of any of the following backplate metals; Ti, Mo, Cu, Cr, Ni, Fe, Co, W, Mn, and Pd; and
   wherein said backplate electrode means includes a metal layer which is formed on said silicon back surface and which contains any of said backplate metals, and said metal silicide film is formed on said metal layer.

2. A device according to claim 1, wherein said metal layer includes two films of different backplate metals.

3. A semiconductor device comprising:
   a semiconductor pellet having a top surface and a back surface and formed by a semiconductor material, wherein said semiconductor pellet is formed of silicon; and
   backplate electrode means, including a metal silicide film having conductivity and an anti-oxidation property and wherein the metal silicide film forms the outermost surface of the backplate electrode means, said backplate electrode means being formed on the entire back surface of said pellet to form a backplate electrode surface layer, for obtaining at said back surface of said pellet a substantially uniform backplate potential;
   wherein said metal silicide film essentially consists of a silicide of any of the following backplate metals; Ti, Mo, Cu, Cr, Ni, Fe, Co, W, Mn, and Pd; and
   wherein said backplate electrode means includes a metal layer which is formed on said back surface and which contains any of said backplate metals, and said metal silicide film is formed on said metal layer to form the backplate electrode surface layer.

4. A device according to claim 3, wherein said metal layer includes two films of different backplate metals.

5. A semiconductor device comprising:
   a semiconductor pellet integrating a number of circuit elements therein having a top surface and a back surface and formed by a semiconductor material, wherein said semiconductor pellet is formed of silicon; and
   backplate electrode means, including a metal silicide film having conductivity and an anti-oxidation property and wherein the metal silicide film forms the outermost surface of the backplate electrode means, said backplate electrode means being formed on the entire back surface of said pellet to form a backplate electrode surface layer, for obtaining at said back surface of said pellet a substantially uniform backplate potential;
   wherein said metal silicide film essentially consists of a silicide of any of the following backplate metals; Ti, Mo, Cu, Cr, Ni, Fe, Co, W, Mn, and Pd; and
   wherein said backplate electrode means includes a metal layer which is formed on said back surface and which contains any of said backplate metals, and said metal silicide film is formed on said metal layer to form the backplate electrode surface layer.

6. A device according to claim 5, wherein said metal layer includes two films of different backplate metals.

7. A semiconductor device comprising:
   a semiconductor pellet integrating a number of circuit elements therein having a top surface and a back surface and formed by a semiconductor material, wherein said semiconductor pellet is formed of silicon; and
   backplate electrode means, including a metal silicide film having conductivity and an anti-oxidation property and wherein the metal silicide film forms the outermost surface of the backplate electrode means, said backplate electrode means being formed on the entire back surface of said pellet to form the outermost surface of the semiconductor device, for obtaining at said back surface of said pellet a substantially uniform backplate potential;
   wherein said metal silicide film essentially consists of a silicide of any of the following backplate metals; Ti, Mo, Cu, Cr, Ni, Fe, Co, W, Mn, and Pd; and
   wherein said backplate electrode means includes a metal layer which is formed on said back surface and which contains any of said backplate metals, and said metal silicide film is formed on said metal layer to form the outermost surface of the semiconductor device.

8. A device according to claim 7, wherein said metal layer includes two films of different backplate metals.

9. A semiconductor device comprising:
   a semiconductor pellet having a top surface and a back surface and formed by a semiconductor material, wherein said semiconductor pellet is formed of silicon; and
   backplate electrode means, including a metal silicide film having conductivity and an anti-oxidation property and wherein the metal silicide film forms the outermost surface of the backplate electrode means, said backplate electrode means being formed on the entire back surface of said pellet to form the outermost surface of the semiconductor device, for obtaining at said back surface of said pellet a substantially uniform backplate potential;
   wherein said metal silicide film essentially consists of a silicide of any of the following backplate metals; Ti, Mo, Cu, Cr, Ni, Fe, Co, W, Mn, and Pd; and
   wherein said backplate electrode means includes a metal layer which is formed on said back surface and which contains any of said backplate metals, and said metal silicide film is formed on said metal layer to form the outermost surface of the semiconductor device.

10. A device according to claim 9, wherein said metal layer includes two films of different backplate metals.

* * * * *